United States Patent
Davis

(10) Patent No.: US 9,255,033 B2
(45) Date of Patent: Feb. 9, 2016

(54) PIEZOELECTRIC GLASS CERAMIC COMPOSITIONS AND PIEZOELECTRIC DEVICES MADE THEREFROM

(71) Applicant: SCHOTT Corporation, Elmsford, NY (US)

(72) Inventor: Mark J. Davis, Clarks Summit, PA (US)

(73) Assignee: SCHOTT CORPORATION, Elmsford, NY (US)

(*) Notice: Subject to any disclaimer, the term of this patent is extended or adjusted under 35 U.S.C. 154(b) by 162 days.

(21) Appl. No.: 13/968,785

(22) Filed: Aug. 16, 2013

(65) Prior Publication Data

US 2015/0048717 A1    Feb. 19, 2015

(51) Int. Cl.
| | |
|---|---|
| H01L 41/187 | (2006.01) |
| C04B 35/14 | (2006.01) |
| C03C 10/00 | (2006.01) |
| C03C 3/078 | (2006.01) |
| C03B 32/02 | (2006.01) |
| H01L 41/18 | (2006.01) |

(52) U.S. Cl.
CPC ............... *C04B 35/14* (2013.01); *C03B 32/02* (2013.01); *C03C 3/078* (2013.01); *C03C 10/0009* (2013.01); *C03C 10/0072* (2013.01); *H01L 41/18* (2013.01); *H01L 41/187* (2013.01); *H01L 41/1871* (2013.01); *C03C 2203/50* (2013.01); *C04B 2235/3213* (2013.01); *C04B 2235/3232* (2013.01); *C04B 2235/785* (2013.01)

(58) Field of Classification Search
CPC   C03C 10/0072; C03C 10/0009; C03C 3/078; C03C 2203/50; H01L 41/187; H01L 41/1871; C03B 32/02

USPC ................ 252/62.9 R; 65/33.1; 501/4, 10, 5
See application file for complete search history.

(56) References Cited

U.S. PATENT DOCUMENTS

| | | | |
|---|---|---|---|
| 7,591,961 B2 * | 9/2009 | Gudgel et al. | ........... 252/62.9 R |
| 8,141,387 B2 * | 3/2012 | Letz et al. | ...................... 65/33.2 |
| 2007/0199348 A1 * | 8/2007 | Gudgel et al. | ................. 65/33.1 |
| 2007/0203011 A1 | 8/2007 | Gudgel et al. | |
| 2008/0066683 A1 | 3/2008 | Fujimura et al. | |
| 2009/0215605 A1 | 8/2009 | Letz et al. | |

FOREIGN PATENT DOCUMENTS

| | | |
|---|---|---|
| JP | 58084516 A | 5/1983 |
| JP | 2011230960 A | 11/2011 |

OTHER PUBLICATIONS

Ruiz-Vald's et al; "Glass Ceramic Materials with Regulated Dielectric Properties based on the System BaO?PbO?TiO2?B2O3?Al2-O3"; Journal of the European Ceramic Society 24, No. 6 (2004); pp. 1505-1508.

(Continued)

*Primary Examiner* — Carol M Koslow
(74) *Attorney, Agent, or Firm* — Ohlandt, Greeley, Ruggiero & Perle, LLP

(57) ABSTRACT

A piezoelectric glass ceramic represented by the formula $$(M_1O_x)\text{-}(M_2O_y)\text{---}SiO_2$$

wherein $M_1$ is one or more metals and/or metalloids, $M_2$ is one or more metals and/or metalloids, x is a value equal to the valence of $M_1$, and y is a value equal to the valence of $M_2$. The piezoelectric glass ceramic has a total alkali metal concentration of less than about 1000 parts per million by weight (ppmw). A process of preparing a piezoelectric glass ceramic and a piezoelectric glass ceramic body prepared therefrom.

27 Claims, 2 Drawing Sheets

(56) References Cited

OTHER PUBLICATIONS

International Search Report dated Nov. 13, 2014 for PCT application No. PCT/US2014/050470.

Written Opinion dated Nov. 13, 2014 for PCT application No. PCT/US2014/050470.

Zhang, S. et al., "Piezoelectric accelerometers for ultrahigh temperature application;" Applied Physics Letters, vol. 96, 2010, 013506, pp. 1-3.

* cited by examiner

PIEZOELECTRIC GLASS CERAMIC COMPOSITIONS AND PIEZOELECTRIC DEVICES MADE THEREFROM

BACKGROUND OF THE DISCLOSURE

1. Field of the Disclosure

The present disclosure is related to the field of piezoelectric materials. More particularly, the present disclosure is related to piezoelectric glass ceramic materials suitable for high temperature applications.

2. Description of Related Art

Piezoelectric sensors and actuators have experienced tremendous growth and wide spread application since the initial work with $Pb(Ti,Zr)O_3$, hereinafter "PZT", in the early 1950's. Since then, PZT-based piezoelectric devices have dominated the world market. They are widely used in underwater sonar, vibration dampening equipment, medical ultrasound transducers, high frequency buzzers and speakers, fuel injection actuators, and precision positioners. These devices have also been incorporated into "Smart Systems" or "Smart Structures," utilizing these device's dual nature as both a sensor and an actuator. Some proposed applications are for variable control surfaces or noise/vibration suppression in aerospace and automotive applications.

However, the current temperature limitations of PZT-based devices have restricted these types of applications. The PZT-based devices are limited by the Curie temperature ($T_C$) of these materials; the temperature indicating the complete loss of piezoelectric properties, typically less than 350° C. It is noted, however, that property degradation typically occurs at temperatures lower than the $T_C$, for example, at approximately ½ $T_C$, associated with an irreversible depoling reaction.

Research has not provided a way to increase the Curie temperature ($T_c$) for PZT-based materials.

Although devices based on PZT materials have been around for over 50 years, as temperature requirements for particular applications continue to rise, more and more standard materials (e.g, PZT materials) simply do not function at these conditions, particularly above 500° C. This particular temperature range, now actively sought by sensor and device manufacturers, is currently the sole domain of select single crystals, e.g., langatate, langasite, $GaPO_4$ and YCOB and its variants.

Ferroelectric ceramics have been pushed to higher temperatures for well over two decades now, but essentially none are functionally useful at temperatures significantly above 500° C. As indicated above, single crystals have been developed that do seem to meet most or all of the requirements, but these single crystals are expensive to produce.

Piezoelectric glass ceramic materials provide an alternative to conventional piezoelectric materials such as PZT ceramics. Since PZT apart from zirconium and titanium contains lead, piezoelectric glass ceramics have a potential to replace PZT as an alternative lead-free material.

U.S. Pat. No. 7,591,961 discloses lithium-based piezoelectric glass ceramic materials $Li_2O$—$B_2O_3$—$SiO_2$ that are translucent at least in the visible light range or in the infrared range. U.S. Patent Application Publication No. 2007/0199348 discloses a method of preparing lithium-based piezoelectric glass ceramic materials $Li_2O$—$B_2O_3$—$SiO_2$. While these lithium-based piezoelectric glass ceramic materials are functional at ambient conditions, they are not useful at temperatures above 200° C. due to the high mobility of lithium itself.

These lithium-based piezoelectric glass ceramic materials are not deemed useful for high temperature applications because of their sensitivity to thermal changes, and are not competitive with existing high temperature materials. Therefore, because of these property deficiencies, the lithium-based piezoelectric glass ceramic materials are not considered viable candidates for high temperature applications for state-of-the-art, technically demanding material fields.

SUMMARY OF THE DISCLOSURE

In accordance with this disclosure, it has been found that certain piezoelectric glass ceramics, particularly those with oriented, polar (non-centrosymmetric) crystals and that have high electrical resistivity, can actively participate in high temperature applications for state-of-the-art, technically-demanding material fields.

The piezoelectric glass ceramic compositions of this disclosure are non-ferroelectric, contain substantially no alkali metal, exhibit excellent piezoelectric characteristics (electromechanical coupling coefficient, piezoelectric strain constant, and relative dielectric constant), have high heat durability, and exhibit essentially no phase transition at temperatures below about 700° C. The piezoelectric glass ceramic compositions of this disclosure can undergo extensive crystal alignment during crystallization which is a necessary condition for piezoelectric function.

In particular, the piezoelectric glass ceramic compositions of this disclosure exhibit desired high temperature piezoelectric properties. These desired high temperature piezoelectric properties are attributable at least in part to the piezoelectric glass ceramic composition being non-ferroelectric, which removes problems encountered with aging of ferroelectric piezoelectric materials when used at temperatures approaching their Curie temperature ($T_c$), above which the ferroelectric piezoelectric materials abruptly depole and are no longer functionally piezoelectric.

Also, these desired high temperature piezoelectric properties are attributable at least in part to the piezoelectric glass ceramic compositions containing substantially no alkali metal. Preferably, the piezoelectric glass ceramic compositions contain less than about 1,000 ppmw, more preferably less than about 500 ppmw, and even more preferably less than about 250 ppmw. Substantially no alkali metal allows electrical resistivity to be very high which is necessary for high temperature applications.

Further, these desired high temperature piezoelectric properties are attributable at least in part to the piezoelectric glass ceramic compositions exhibiting essentially no phase transition at a temperature below about 500° C. or even below about 700° C. (i.e., melting or solid-solid structural transitions). Such phase transitions, if they occur, can stop all piezoelectric activity.

The piezoelectric glass ceramic compositions of this disclosure can help satisfy the demand for piezoelectric ceramic materials that exhibit high heat durability and that can be employed in devices which are exposed to high-temperature atmospheres (e.g., a knock sensor or a combustion pressure sensor). The piezoelectric glass ceramic compositions of this disclosure provide a highly functional, lower-cost alternative to the more expensive single crystal materials for high temperature piezoelectric applications (e.g., sensors and associated devices).

The above-described and other features and advantages of the present disclosure will be appreciated and understood by those skilled in the art from the following detailed description, drawings, and appended claims.

DESCRIPTION OF THE PREFERRED EMBODIMENT

The piezoelectric glass ceramic compositions of this disclosure can be widely employed in, for example, vibration sensors, pressure sensors, oscillators, and piezoelectric devices, that require excellent heat durability. For example, the piezoelectric glass ceramic compositions can be employed in a variety of piezoelectric devices such as accelerometers, ultrasonic flow meters, vibration sensors (e.g., a knock sensor or a combustion pressure sensor), vibrators, actuators, and filters; high-voltage-generating devices; micro power supplies; a variety of driving devices; position control devices; vibration control devices; and fluid discharge devices (e.g., a paint discharge device or a fuel discharge device). Particularly, the piezoelectric glass ceramic compositions are suitable for use in devices requiring excellent heat durability (e.g., a knock sensor or a combustion pressure sensor).

Figure 2:
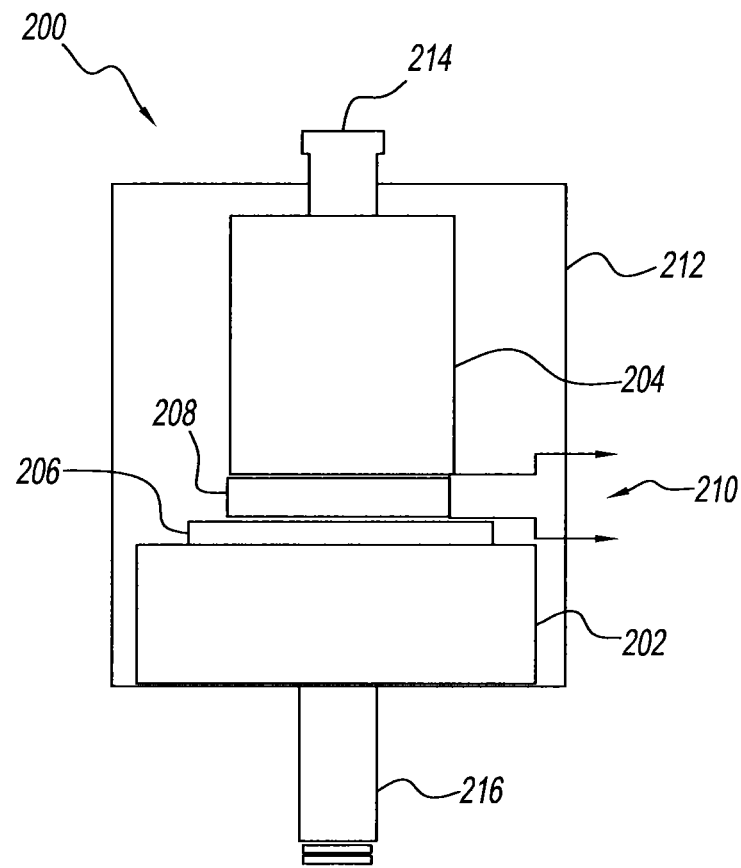
FIG. 2 shows a schematic diagram of a monolithic compression-mode accelerometer assembly that includes a piezoelectric element comprising a piezoelectric glass ceramic composition of this disclosure.

An illustrative device which incorporates the piezoelectric glass ceramic compositions of this disclosure is shown in FIG. 2. The device 200 is a monolithic compression-mode accelerometer assembly, in which 204 is a seismic mass, whose inertial force under acceleration is measured by a piezoelectric glass ceramic crystal transduction element 208. A screw 214 passing through the preloading sleeve 212 compresses the piezoelectric element 208 (e.g., a piezoelectric glass ceramic composition of this disclosure) between the seismic mass 204 and the base plate 202. Further in FIG. 2, 206 is insulation (e.g., high purity alumina for electrical insulation) and 210 are top and bottom electrodes. Rod 216 is used for attachment purposes.

The piezoelectric glass ceramic compositions of the present disclosure exhibit excellent heat durability. The piezoelectric glass ceramic compositions exhibit excellent performance in a well-balanced manner without impairing piezoelectric characteristics (including electromechanical coupling coefficient, piezoelectric strain constant, and relative dielectric constant). The piezoelectric glass ceramic compositions of the present disclosure, which contain substantially no alkali metal, is advantageous from the viewpoint of high temperature applications. As used herein, the expression "a piezoelectric glass ceramic composition which contains substantially no alkali metal" refers to the case where the composition does not contain intentionally added alkali metal. Thus, a piezoelectric glass ceramic composition containing, as an unavoidable impurity, alkali metal in a very small amount (generally less than 1,000 ppmw) is acceptable in the present disclosure. However, from the viewpoint of reliable high temperature applications, a piezoelectric glass ceramic composition containing no alkali metal is preferred.

When the piezoelectric glass ceramic compositions contain substantially no alkali metal, the piezoelectric glass ceramic compositions maintain excellent heat durability, and the composition exhibits excellent piezoelectric characteristics (including electromechanical coupling coefficient, piezoelectric strain constant, and relative dielectric constant) in a well-balanced manner.

The piezoelectric glass ceramic compositions of this disclosure can be represented by the formula

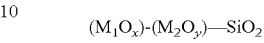

wherein $M_1$ and $M_2$ are independently one or more metals and/or metalloids, x is a value equal to the valence of $M_1$, and y is a value equal to the valence of $M_2$; wherein said piezoelectric glass ceramic has a total alkali metal concentration of less than about 1000 parts per million by weight (ppmw).

No particular limitations are imposed on the oxides of $M_1$ and $M_2$. Preferably, $M_1$ is one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids. The valence of the one or more metals and/or metalloids is equal to the valence of the one or more Group 2 elements. Preferably, $M_2$ is one or more Group 4 elements selected from the group consisting of Ti, Zr and Hf, or a mixture of one or more Group 4 elements selected from the group consisting of Ti, Zr and Hf with one or more metals and/or metalloids. The valence of the one or more metals and/or metalloids is equal to the valence of the one or more Group 4 elements. $M_1$ and $M_2$ are independent and are chosen to provide excellent piezoelectric characteristics.

The piezoelectric glass ceramic compositions are non-ferroelectric and contain substantially no alkali metal. Preferably, the piezoelectric glass ceramic composition contains less than about 1,000 ppmw, more preferably less than about 500 ppmw, and even more preferably less than about 250 ppmw.

The piezoelectric glass ceramic compositions exhibit essentially no phase transition at a temperature below about 500° C. or even below about 700° C. (i.e., melting or solid-solid structural transitions).

In an embodiment, the piezoelectric glass ceramic compositions of this disclosure can be represented by the formula

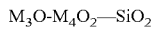

wherein $M_3$ is one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids; and $M_4$ is one or more Group 4 elements selected from the group consisting of Ti, Zr and Hf, or a mixture of one or more Group 4 elements selected from the group consisting of Ti, Zr and Hf with one or more metals and/or metalloids; wherein said piezoelectric glass ceramic has a total alkali metal concentration of less than about 1000 parts per million by weight (ppmw).

A preferred piezoelectric glass ceramic compositions of the present disclosure is represented by the formula

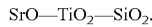

A preferred precursor glass body prepared from the piezoelectric glass ceramic compositions comprises from about 70 to 80 wt. % of $SiO_2$ from about 15 to 25 wt. % of $TiO_2$ and from about 5 to 15 wt. % of SrO. The preferred piezoelectric glass ceramic composition has an average crystal size of less than about 500 nanometers. The preferred piezoelectric glass ceramic composition comprises crystallites of the type selected from the group formed by titanium silicate, strontium silicate, strontium titanium silicate, and quartz.

Piezoelectric glass ceramic compositions of the present disclosure are preferably chosen according to the following scheme: 1) the main crystalline phase belongs to one of the 21 non-centrosymmetric point groups, thereby allowing for the potential of a piezoelectric glass ceramic; 2) the system should be reasonably easy to melt and hot-form into desired shapes; 3) the crystallites should exhibit a strong tendency to align during crystallization; and 4) the glass ceramic should have good mechanical strength, thus allowing for the possibility of producing parts for actual applications.

The piezoelectric glass ceramic compositions of this disclosure can undergo extensive crystal alignment during crystallization which is a necessary condition for piezoelectric function.

No particular limitations are imposed on the process for producing the piezoelectric glass ceramic compositions of the present disclosure, but generally, the production method includes a raw material preparation step, melting step, hot-forming step, and a ceramization step, the process by which the glass is controllably crystallized into a glass ceramic.

In the raw material preparation step, the raw material of the piezoelectric glass ceramic compositions is prepared from a $M_1$ compound, a $M_2$ compound, and $SiO_2$. The raw material preparation includes, for example, 55 to 80 wt. % of $SiO_2$, 1 to 40 wt. % of $M_1O_x$, and 1 to 40 wt. % of $M_2O_y$. The $M_1$ raw material compounds include, for example, one or more metals and/or metalloids (e.g., one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids). The $M_2$ raw material compounds include, for example, one or more metals and/or metalloids (e.g., one or more Group 4 elements selected from the group consisting of Ti, Zr and Hf, or a mixture of one or more Group 4 elements selected from the group consisting of Ti, Zr and Hf with one or more metals and/or metalloids).

No particular limitations are imposed on the compounds to be employed in the raw material preparation step, except that the raw material compounds should contain substantially no alkali metal. Preferably the raw material compounds should contain less than about 1,000 ppmw, more preferably less than about 500 ppmw, and even more preferably less than about 250 ppmw. Preferred examples of the compounds to be employed include oxides of metallic or metalloid elements. Optional examples of the compounds that can be employed include carbonates, hydroxides, hydrogen carbonates, nitrates, and organometallic compounds of metallic or metalloid elements. No particular limitations are imposed on the form of the compound to be employed, and the compound may be in the form of like powder or liquid. The compound to be employed may contain only one species of the aforementioned metallic or metalloid elements, or two or more species of the metallic or metalloid elements.

In the melting step, the ceramic raw material prepared in the raw material preparation step is melted at high temperatures, typically in excess of 1300° C. No particular limitations are imposed on the melting temperature, the melting time, the melting atmosphere, etc. The melting time may be regulated to 1 to 10 hours. The melting step is generally performed in an air atmosphere.

In the hot-forming step, the product obtained through the melting step is formed into a desired shape. In general, the melted product (glass) is poured into a mold (e.g., steel, graphite, etc.) of a desired shape and volume and then placed into an annealing oven, generally at or above the glass-transition temperature of the material. Subsequently, the glass is then slowly cooled (e.g., 30° C./hr) down to room temperature, thereby relieving any residual stress in the glass body.

In the ceramization step, the product obtained through the hot-forming step is re-heated according to a desired temperature-time profile. No particular limitations are imposed on the ceramization temperature, the ceramization time, the ceramization atmosphere, etc. For example, the ceramization temperature is generally 700 to 1,000° C. The ceramization time may be regulated to 1 to 10 hours. The ceramization step is generally performed in the atmosphere.

In an embodiment, this disclosure provides a process of preparing a piezoelectric glass ceramic which comprises preparing a precursor glass body, placing the precursor glass body in a furnace in contact with a brick body having a larger or smaller thermal capacity than formed by the precursor glass body, and ceraming the precursor glass body within the furnace in contact with the brick body. See, for example, U.S. Patent Application Publication No. 2007/0199348 and U.S. Pat. No. 7,591,961, the disclosures of which are incorporated herein by reference in their entirety.

According to the process of this disclosure, a temperature gradient is employed across the precursor glass during the precipitation of crystallites. This is done within a furnace by placing the precursor glass in contact with a brick body having a larger (or smaller) thermal capacity than formed by the precursor glass body. By controlling the thermal capacity (sometimes also called "heat capacity") of the brick body, the temperature gradient can be specifically controlled. Thermal capacity is defined as the specific heat capacity multiplied by the mass.

Also complex temperature gradients and thereby piezoelectric structures can be generated by a respective brick material body which, for example, may contact the precursor glass body also on one or more face sides apart from the contact at the bottom. Using this "brick method" a controlled temperature gradient can be obtained during the ceraming process in a very simple way whereby a carefully controlled or more pronounced anisotropy of the glass ceramic generated thereby can be effected. In particular, the orientation, distribution and size of the crystals can be controlled or at least influenced thereby.

The temperature gradient that results, when heating the precursor glass body in contact with the brick body, depends largely on the ratio between the thermal capacities given by the brick body and the precursor glass body. Preferably, the ratio between the thermal capacities of the brick body and the precursor glass body is at least 10, preferably at least 100, more preferably at least 1000, mostly preferred at least 10000.

In an embodiment, the brick body that is placed in the furnace in contact with the precursor glass body may be cooled or heated during the ceraming step, this allowing to effect even more pronounced temperature gradients and thus an even more aligned orientation of the precipitated crystallites.

The orientation, distribution and size of the crystals of the glass ceramic may be influenced by the material from which the brick body is made. In addition, also the thermal conductivity of the brick material may influence the temperature gradient and thus also the orientation, distribution and size of the crystals resulting therefrom.

In another embodiment, a brick body may be used which is made of a thermally insulating material such as a material selected from the group formed by silica, alumina and zirconia. Alternatively, also a material may be used, that is a good thermal conductor, such as steel or graphite.

The surface of the precursor glass body in contact in the brick material body, and preferably also the opposite surface, are polished prior to contacting the brick material body. A more pronounced anisotropy can be effected when using this polishing step. The polishing leads to the formation of microcracks which act as nuclei enhancing surface crystallization. Preferably, also the surface(s) of the brick material body that get in contact with the precursor glass body are ground or polished. This can facilitate a high degree of alignment of the crystallites with the glass ceramic.

The brick body can be provided with a recess in which the precursor glass body is placed. The recess may be dimensioned to allow a complete seating of the precursor glass body therein, in a flush configuration or in a configuration recessed within the brick body.

The surface crystallization starts only from one surface whereby an improved orientation, distribution and size of the crystals can be reached. The surface crystallization starting from a surface may be further enhanced by seeding at least one surface of the precursor glass body by thermal or chemical treatment. While the depth of the crystallization which can be reached using surface crystallization as the main crystallization mechanism is somewhat limited, a crystallization depth in the range of one millimeter or even more can be reached. The crystallization depth in some cases may be even more increased by using a precursor glass that is prepared with nucleating agents within the bulk. For this purpose the precursor glass body may be prepared with a particular nucleation step to reach a certain homogeneous nucleation within the precursor glass before ceraming the precursor glass within a temperature gradient.

The process may further comprise the step of establishing a gas flow within the furnace, the gas flow being directed to influence the temperature gradient established within the precursor glass body.

The process may further comprise the step of treating the surface(s) of the brick body that get into contact with the precursor glass body to effect easy removal of the ceramized body after ceramization, in particular by treating the surface(s) with soapstone.

In an embodiment, this disclosure provides a process of preparing a piezoelectric glass ceramic which comprises preparing a precursor glass body, placing the precursor glass body in a furnace in contact with a ceramic fabric having a thermal capacity different from a thermal capacity of the precursor glass body; and ceraming the precursor glass body within the furnace in contact with the ceramic fabric. The ceramic fabric can include, for example, a brick body as described herein. Ceramic fabrics are commercially available, for example, from Unifrax I LLC, as Fiberfrax® materials.

The piezoelectric element of the present disclosure includes a piezoelectric member formed of the piezoelectric glass ceramic composition of the present disclosure, and at least a pair of electrodes which are in contact with the piezoelectric member.

The aforementioned "piezoelectric member," which is a part of the piezoelectric element, exhibits piezoelectric characteristics. No particular limitations are imposed on the form and size of the piezoelectric member. Preferably, the form and size of the piezoelectric member are appropriately determined in accordance with the intended use of the piezoelectric element; for example, a vibration sensor, a pressure sensor, an oscillator, or a piezoelectric device. The piezoelectric member may be in a variety of forms, including a rectangular plate, a circular plate, a plate having, in its center, a through hole provided in a thickness direction, a rectangular column, and a circular column. The piezoelectric element may be formed through stacking of a plurality of piezoelectric members having such a form.

The aforementioned "a pair of electrodes" are electrically conductive layers formed on the surface(s) of the piezoelectric member. These electrodes may be formed respectively on one surface and the other surface of the piezoelectric member, or the electrodes may be formed on the same surface of the piezoelectric member. No particular limitations are imposed on the form, size, material, etc. of the electrodes. Preferably, the form, etc. of the electrodes are appropriately determined in accordance with, for example, the size of the piezoelectric member or the intended use of the piezoelectric element. The electrodes may have a plane form. Particularly when a pair of electrodes are formed on the same surface of the piezoelectric member, the electrodes may have a comb-tooth-like form. No particular limitations are imposed on the method for forming the electrodes, but generally, the electrodes are formed by applying a conductive paste onto the predetermined surface(s) of the piezoelectric member, followed by baking.

The conductive paste can be prepared by use of a glass frit, an electrically conductive component, and an organic medium.

The glass frit to be employed may contain, for example, $SiO_2$, $Al_2O_3$, $ZnO$, or $TiO_2$. This glass frit can enhance the joint strength between the piezoelectric member formed of the piezoelectric glass ceramic composition and a pair of electrodes.

The electrically conductive component to be employed may be, for example, powder of a noble metal (e.g., silver, gold, palladium, or platinum); a powder mixture containing two or more of such noble metal powders; or powder of an alloy formed of two or more noble metals. Alternatively, the electrically conductive component may be, for example, powder of copper, nickel, or the like; a mixture of such metal powders; or powder of an alloy formed of such metals. This electrically conductive component is particularly preferably silver powder, palladium powder, or powder of a silver-palladium alloy. The average particle size of such electrically conductive powder is preferably 20 μm or less (more preferably 1 to 5 μm). When the average particle size is 20 μm or less, electrodes can be formed through screen printing without firing. This electrically conductive component is generally incorporated such that the amount thereof accounts for 70 to 99 mass % of the solid content of the conductive paste.

The organic medium to be employed may be a medium which is generally employed for preparing such a conductive paste; for example, an alcohol, an ester, or an ether. The organic medium is generally incorporated in an amount of about 10 to about 40 mass % on the basis of the entirety (100 mass %) of the conductive paste.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

EXAMPLES

Figure 1:
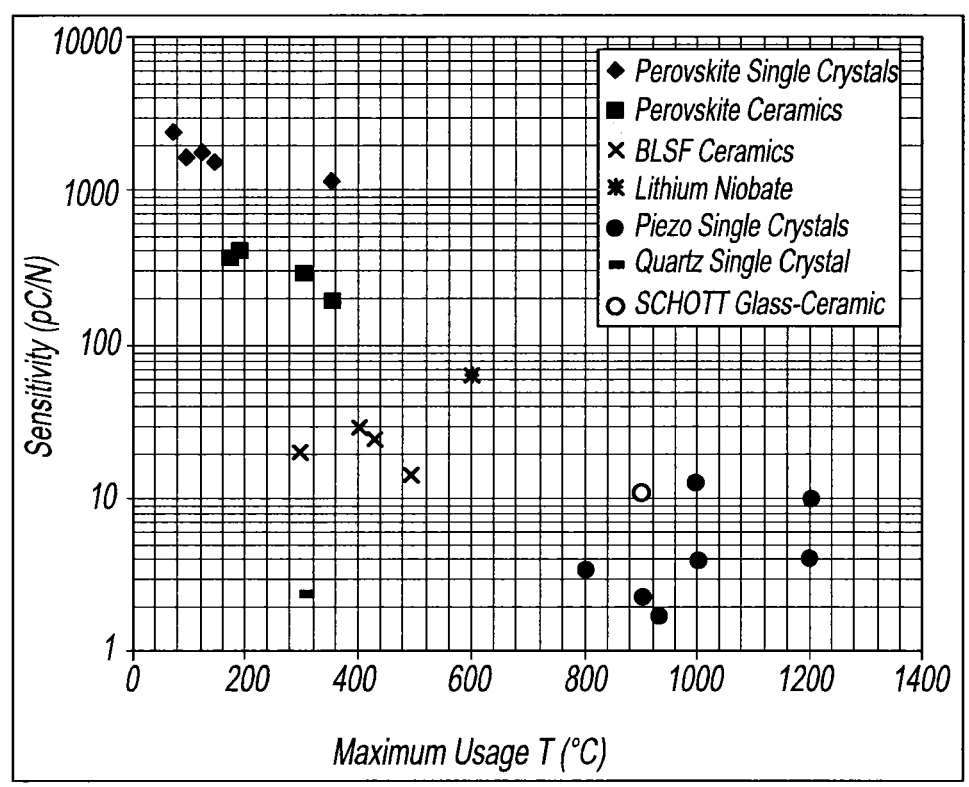
FIG. 1 graphically illustrates the maximum usage temperature of piezoelectric materials, taken either at or near a ferroelectric material's Curie temperature or, for non-ferroelectric materials, at the temperature at which its electrical resistivity drops to $10^6$ ohm-cm.

A $SrO—TiO_2—SiO_2$ system was prepared. Initial test results readily provided glassy starting materials and subsequent thermal processing produced functionally active materials for characterization purposes. As shown in FIG. 1, the resulting electrical resistivity values compared favorably with the relevant single crystals and out-perform all of the high temperature ceramics. Also, as shown in FIG. 1, piezoelectric sensitivity was also highly competitive with single crystals.

FIG. 1 graphically illustrates the maximum usage temperature of piezoelectric materials, taken either at or near a ferroelectric material's Curie temperature or, for non-ferroelectric materials, at the temperature at which its electrical resistivity drops to $10^6$ ohm-cm. FIG. 1 thus provides a useful guide to a material's upper use temperature. FIG. 1 was modified from Zhang and Yu, J. Am. Ceram. Soc., vol 94 (10), 3153-3170, 2011. The most desirable set of material properties is located in the upper right portion of the FIG. 1 diagram, which is devoid of any actual materials. The Schott glass ceramic is in a region occupied only by single crystals.

The piezoelectric glass ceramic compositions of this disclosure provide a highly functional, lower-cost alternative to the more expensive single crystal materials for high temperature piezoelectric applications (e.g., sensors and associated devices).

What is claimed is:

1. A piezoelectric glass ceramic represented by the formula $$(M_1O_x)\text{-}(M_2O)\text{---}SiO_2$$

wherein $M_1$ and $M_2$ are independently one or more metals and/or metalloids, x is a value equal to the valence of $M_1$, and y is a value equal to the valence of $M_2$; wherein said piezoelectric glass ceramic has a total alkali metal concentration of less than about 1000 parts per million by weight (ppmw); and wherein the piezoelectric glass ceramic is non-ferroelectric.

2. The piezoelectric glass ceramic of claim 1, wherein $M_1$ is one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids, wherein the valence of the one or more metals and/or metalloids is equal to the valence of the one or more Group 2 elements, and wherein $M_2$ is one or more Group 4 elements selected from the group consisting of Ti, Zr and Hf, or a mixture of one or more Group 4 elements selected from the group consisting of Ti, Zr and Hf with one or more metals and/or metalloids, and wherein the valence of the one or more metals and/or metalloids is equal to the valence of the one or more Group 4 elements.

3. The piezoelectric glass ceramic of claim 1, wherein the piezoelectric glass ceramic has a total alkali metal concentration of less than about 500 parts per million by weight (ppmw).

4. The piezoelectric glass ceramic of claim 1, wherein the piezoelectric glass ceramic exhibits essentially no phase transition at a temperature below about 500° C.

5. A piezoelectric glass ceramic represented by the formula $$M_3O\text{-}M_4O_2\text{---}SiO_2$$

wherein $M_3$ is one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids, wherein $M_4$ is one or more Group 4 elements selected from the group consisting of Ti, Zr and Hf, or a mixture of one or more Group 4 elements selected from the group consisting of Ti, Zr and Hf with one or more metals and/or metalloids, wherein said piezoelectric glass ceramic has a total alkali metal concentration of less than about 1000 parts per million by weight (ppmw), and wherein the piezoelectric glass ceramic is non-ferroelectric.

6. The piezoelectric glass ceramic of claim 5, wherein the piezoelectric glass ceramic has a total alkali metal concentration of less than about 500 parts per million by weight (ppmw).

7. The piezoelectric glass ceramic of claim 5, wherein the piezoelectric glass ceramic exhibits essentially no phase transition at a temperature below about 500° C.

8. The piezoelectric glass ceramic of claim 5, represented by the formula $$SrO\text{---}TiO_2\text{---}SiO_2.$$

9. A piezoelectric glass ceramic prepared from a precursor glass body by a ceraming process, the piezoelectric glass ceramic comprising non-ferroelectric piezo-active crystallites precipitated from the precursor glass body, wherein the precursor glass body comprises 55 to 80 wt. % of $SiO_2$, 1 to 40 wt. % of $M_3O$, and 1 to 40 wt. % of $M_4O_2$, wherein $M_3$ is one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids, wherein $M_4$ is one or more Group 4 elements selected from the group consisting of Ti, Zr and Hf, or a mixture of one or more Group 4 elements selected from the group consisting of Ti, Zr and Hf with one or more metals and/or metalloids, wherein the piezoelectric glass ceramic has a total alkali metal concentration of less than about 1000 parts per million by weight (ppmw), and wherein the piezoelectric glass ceramic is non-ferroelectric.

10. The piezoelectric glass ceramic of claim 9, wherein the precursor glass body comprises from about 70 to 80 wt. % of $SiO_2$, from about 15 to 25 wt. % of $TiO_2$ and from about 5 to 15 wt. % of SrO.

11. The piezoelectric glass ceramic of claim 9, wherein the piezoelectric glass ceramic has an average crystal size of less than about 500 nanometers.

12. The piezoelectric glass ceramic of claim 9, wherein the piezoelectric glass ceramic comprises crystallites of the type selected from the group formed by titanium silicate, strontium silicate, strontium titanium silicate, and quartz.

13. A piezoelectric element characterized by comprising a piezoelectric member formed of a piezoelectric glass ceramic as recited in claim 1, and at least a pair of electrodes which are in contact with the piezoelectric member.

14. A process of preparing a piezoelectric glass ceramic, said process comprising:
preparing a precursor glass body which comprises 55 to 80 wt. % of $SiO_2$, 1 to 40 wt. % of $(M_1O_x)$ and 1 to 40 wt. % of $(M_2O_y)$, wherein $M_1$ and $M_2$ are independently one or more metals and/or metalloids, x is a value equal to the valence of $M_1$, and y is a value equal to the valence of $M_2$, and wherein said precursor glass body has a total alkali metal concentration of less than about 1000 parts per million by weight (ppmw);
placing the precursor glass body in a furnace in contact with a ceramic fabric having a thermal capacity different from a thermal capacity of the precursor glass body;
ceraming the precursor glass body within the furnace in contact with the ceramic fabric; and
wherein the piezoelectric glass ceramic is non-ferroelectric.

15. A process of preparing a piezoelectric glass ceramic, said process comprising:
preparing a precursor glass body which comprises 55 to 80 wt. % of $SiO_2$, 1 to 40 wt. % of $(M_1O_x)$ and 1 to 40 wt.

% of ($M_2O_y$), wherein $M_1$ and $M_2$ are independently one or more metals and/or metalloids, x is a value equal to the valence of $M_1$, and y is a value equal to the valence of $M_2$, and wherein said precursor glass body has a total alkali metal concentration of less than about 1000 parts per million by weight (ppmw);

placing the precursor glass body in a furnace in contact with a brick body having a thermal capacity different from a thermal capacity of the precursor glass body;

ceraming the precursor glass body within the furnace in contact with the brick body to form the piezoelectric glass ceramic; and wherein the piezoelectric glass ceramic is non-ferroelectric.

16. The process of claim 15, wherein the piezoelectric glass ceramic is represented by the formula $$M_3O\text{-}M_4O_2\text{—}SiO_2$$

wherein $M_3$ is one or more Group 2 elements selected from the group consisting of Be, Mg, Ca, Sr and Ba, or a mixture of one or more Group 2 elements selected from the group consisting of Be, Mg, Ca, Sr and Ba with one or more metals and/or metalloids, and $M_4$ is one or more Group 4 elements selected from the group consisting of Ti, Zr and Hf, or a mixture of one or more Group 4 elements selected from the group consisting of Ti, Zr and Hf with one or more metals and/or metalloids, and wherein said piezoelectric glass ceramic has a total alkali metal concentration of less than about 500 parts per million by weight (ppmw).

17. The process of claim 15, wherein a ratio between the thermal capacity of the brick body and the thermal capacity of the precursor glass body is at least 10.

18. The process of claim 15, further comprising the step of polishing at least the surface of the precursor glass body in contact in the brick body prior to contacting the brick body.

19. The process of claim 15, further comprising the step of seeding at least one surface of the precursor glass body by thermal or chemical treatment.

20. The process of claim 15, further comprising the step of establishing a gas flow within the furnace, the gas flow being directed to influence the temperature gradient established within the precursor glass body.

21. The process of claim 15, wherein the precursor glass body allows for the precipitation of piezoelectric crystallites therefrom.

22. The process of claim 15, wherein the precursor glass body comprises from about 55 to 80 wt. % of $SiO_2$, from about 1 to 40 wt. % of $M_2O_2$ and from about 1 to 30 wt. % of $M_1O$.

23. The process of claim 15, wherein the brick body is made from a thermally insulating material.

24. A piezoelectric glass ceramic body prepared from a precursor glass body by placing the precursor glass body in a furnace in contact with a brick body having a thermal capacity from a thermal capacity of the precursor glass body, and ceraming the precursor glass body within the furnace in contact with the brick body; wherein the piezoelectric glass ceramic body is non-ferroelectric and contains substantially no alkali metal.

25. The glass ceramic body of claim 24, wherein the precursor glass body precipitates non-ferroelectric piezoelectric crystallites therefrom.

26. A device comprising a piezoelectric element, wherein the piezoelectric element includes a piezoelectric member formed of the piezoelectric glass ceramic of claim 1, and at least a pair of electrodes which are in contact with the piezoelectric member; wherein the piezoelectric glass ceramic body is non-ferroelectric.

27. The device of claim 26, wherein the device is selected from the group consisting of a vibration sensor, pressure sensor, oscillator, accelerometer, ultrasonic flow meter, vibrator, actuator, filter, high-voltage-generating device, micro power supplier, driving device, position control device, vibration control device, and fluid discharge device.

\* \* \* \* \*